US012690414B2

(12) United States Patent
Saito et al.

(10) Patent No.: US 12,690,414 B2
(45) Date of Patent: Jul. 21, 2026

(54) SUBSTRATE HOLDER, SUBSTRATE PROCESSING SYSTEM, AND SUBSTRATE TRANSFER METHOD

(71) Applicant: Tokyo Electron Limited, Tokyo (JP)

(72) Inventors: Yukiyoshi Saito, Koshi City (JP); Keita Hirase, Koshi City (JP); Keisuke Sasaki, Koshi City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/824,124

(22) Filed: Sep. 4, 2024

(65) Prior Publication Data

US 2025/0079217 A1     Mar. 6, 2025

(30) Foreign Application Priority Data

Sep. 5, 2023   (JP) ................................ 2023-143588

(51) Int. Cl.
*H10P 72/30*        (2026.01)
(52) U.S. Cl.
CPC ............................... *H10P 72/3211* (2026.01)
(58) Field of Classification Search
CPC ......... H01L 21/67718; H01L 21/67703; H01L 21/677; H01L 21/67; H01L 21/00; H01L 21/68707; H01L 21/687; H01L 21/683; H01L 21/68728; H01L 21/68714; Y10T 428/12528; Y10T 428/12493; Y10T 428/12; Y10T 428/00
See application file for complete search history.

(56) References Cited

U.S. PATENT DOCUMENTS

| | | | | |
|---|---|---|---|---|
| 5,656,088 A | * | 8/1997 | Sugimoto | B05C 3/04 |
| | | | | 118/423 |
| 10,381,257 B2 | * | 8/2019 | Tang | B25J 9/042 |
| 2006/0290151 A1 | * | 12/2006 | Akiyama | H01L 21/6838 |
| | | | | 294/64.3 |
| 2008/0141943 A1 | * | 6/2008 | Matsumoto | C23C 14/0078 |
| | | | | 118/730 |
| 2008/0267747 A1 | * | 10/2008 | DiBella | H01L 21/68707 |
| | | | | 901/30 |

(Continued)

FOREIGN PATENT DOCUMENTS

| | | |
|---|---|---|
| JP | H09-162157 A | 6/1997 |
| JP | 2009-200476 A | 9/2009 |
| JP | 2022-057798 A | 4/2022 |

*Primary Examiner* — Lawrence Averick
(74) *Attorney, Agent, or Firm* — Chrisman Gallo Tochtrop LLC

(57)        ABSTRACT

A substrate holder includes a main body having a first arm and a second arm whose leading ends are spaced apart from each other and whose base ends are connected to each other; a first holding guide fixed to the leading end of the first arm, and configured to hold a periphery of the substrate; and a second holding guide fixed to the leading end of the second arm, and configured to hold the periphery of the substrate. A length between the first holding guide and the second holding guide is shorter than a diameter of the substrate. In a state that the substrate is located closer to the base ends than a position where the substrate is held by the first holding guide and the second holding guide, the first arm, the second arm, the first holding guide and the second holding guide are located diametrically outside the substrate.

9 Claims, 18 Drawing Sheets

(56)                References Cited

U.S. PATENT DOCUMENTS

2009/0067959 A1*  3/2009  Takahashi ......... H01L 21/67219
                                                 414/226.01
2009/0186557 A1*  7/2009  Torii ..................... B24B 37/345
                                                 451/287
2015/0270151 A1*  9/2015  Yokoyama ........ H01L 21/67751
                                                 414/222.03
2017/0062264 A1*  3/2017  Tang ................. H01L 21/68707
2021/0242084 A1*  8/2021  Kawaguchi ............ B23K 26/36

* cited by examiner

FIG. 4

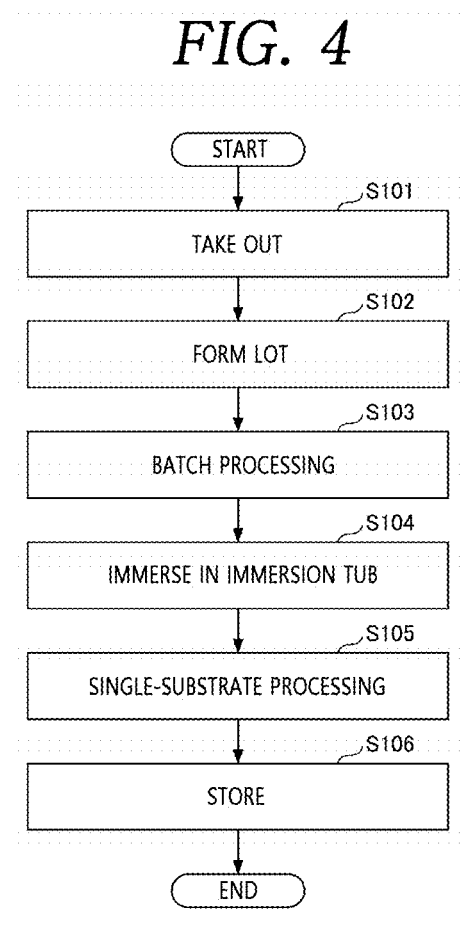

```
                    ( START )
                        │
                        │  S101
           ┌────────────▼────────────┐
           │        TAKE OUT         │
           └────────────┬────────────┘
                        │  S102
           ┌────────────▼────────────┐
           │        FORM LOT         │
           └────────────┬────────────┘
                        │  S103
           ┌────────────▼────────────┐
           │     BATCH PROCESSING    │
           └────────────┬────────────┘
                        │  S104
           ┌────────────▼────────────┐
           │  IMMERSE IN IMMERSION TUB │
           └────────────┬────────────┘
                        │  S105
           ┌────────────▼────────────┐
           │ SINGLE-SUBSTRATE PROCESSING │
           └────────────┬────────────┘
                        │  S106
           ┌────────────▼────────────┐
           │          STORE          │
           └────────────┬────────────┘
                        │
                    (  END  )
```

SUBSTRATE HOLDER, SUBSTRATE PROCESSING SYSTEM, AND SUBSTRATE TRANSFER METHOD

CROSS-REFERENCE TO RELATED APPLICATION

This application claims the benefit of Japanese Patent Application No. 2023-143588 filed on Sep. 5, 2023, the entire disclosure of which is incorporated herein by reference.

TECHNICAL FIELD

The various aspects and embodiments described herein pertain generally to a substrate holder, a substrate processing system, and a substrate transfer method.

BACKGROUND

There is known a substrate transfer device configured to take out a substrate held in a vertical posture and transfer it (see, for example, Patent Documents 1 and 2). Also, there is known a transfer robot configured to hold a substrate disposed on a hand in cooperation with a pusher (see, for example, Patent Document 3).

Patent Document 1: Japanese Patent Laid-open Publication No. 2022-057798

Patent Document 2: Japanese Patent Laid-open Publication No. H9-162157

Patent Document 3: Japanese Patent Laid-open Publication No. 2009-200476

SUMMARY

In an exemplary embodiment, a substrate holder includes a main body having a first arm and a second arm whose leading ends are spaced apart from each other and whose base ends are connected to each other; a first holding guide fixed to the leading end of the first arm, and configured to hold a periphery of the substrate; and a second holding guide fixed to the leading end of the second arm, and configured to hold the periphery of the substrate. A length between the first holding guide and the second holding guide is shorter than a diameter of the substrate. In a state that the substrate is located closer to the base ends than a position where the substrate is held by the first holding guide and the second holding guide, the first arm, the second arm, the first holding guide and the second holding guide are located diametrically outside the substrate on a same plane as the first arm and the second arm.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 4 is a flowchart illustrating a substrate processing method according to the exemplary embodiment;

DETAILED DESCRIPTION

Figure 1:
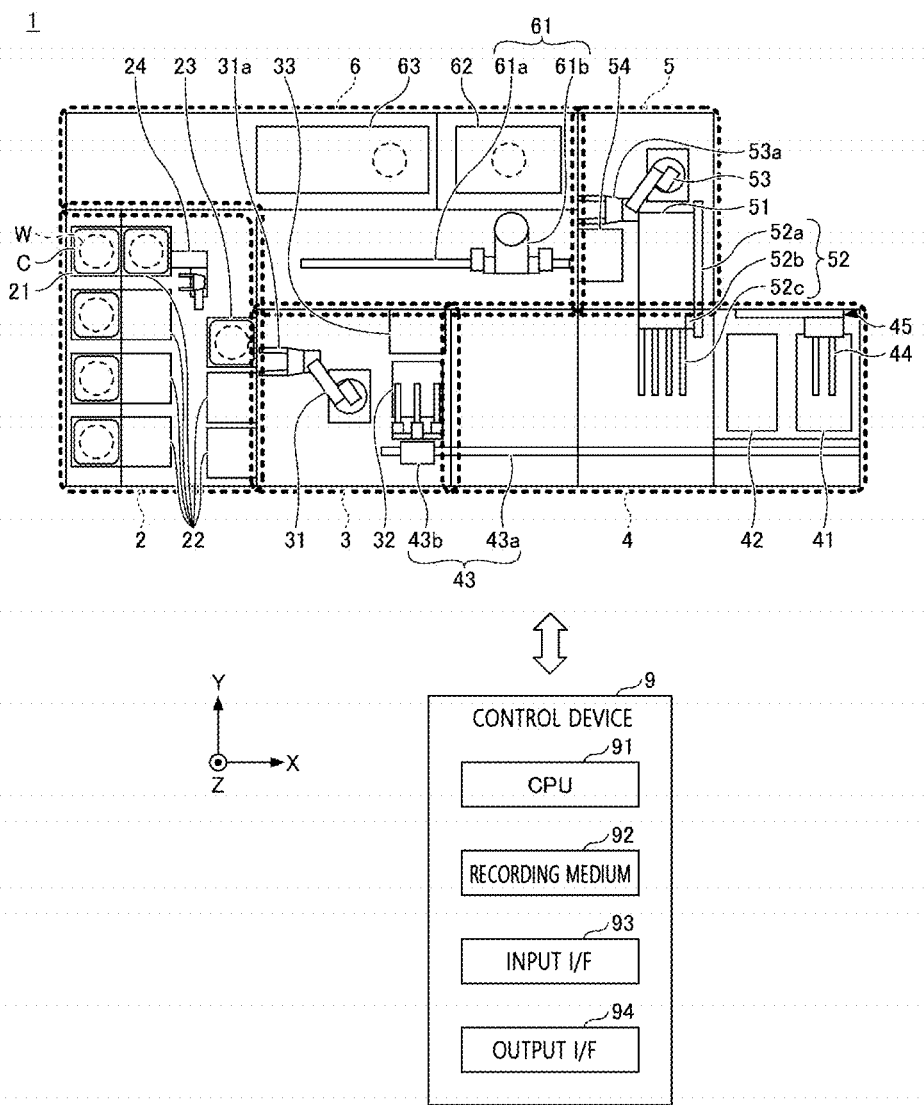
FIG. 1 is a schematic plan view illustrating a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, non-limiting exemplary embodiments of the present disclosure will be described with reference to the accompanying drawings, which form a part hereof. In the various drawings, same or corresponding parts will be assigned same or corresponding reference numerals, and redundant descriptions thereof will be omitted. In the present specification, the X-axis direction, the Y-axis direction, and the Z-axis direction are orthogonal to each other. The X-axis direction and the Y-axis directions are horizontal directions, whereas the Z-axis direction is a vertical direction.

[Substrate Processing System]

Figure 2:
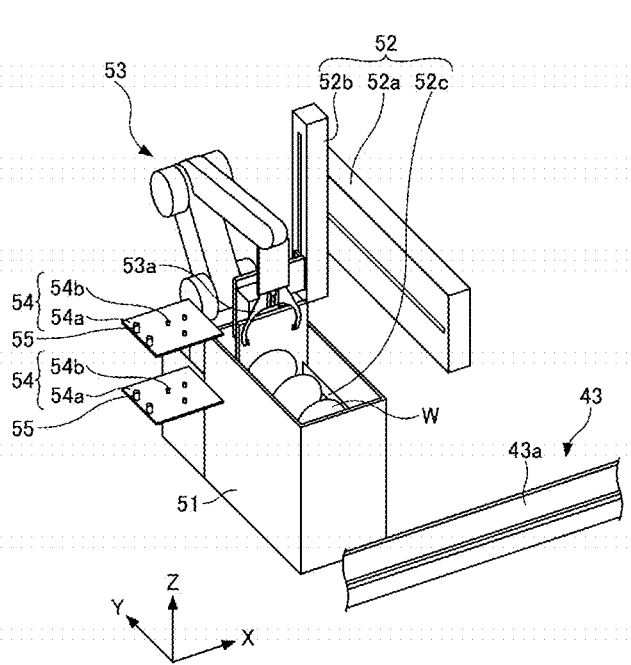
FIG. 2 is a schematic perspective view (1) illustrating a second interface section.
Figure 3:
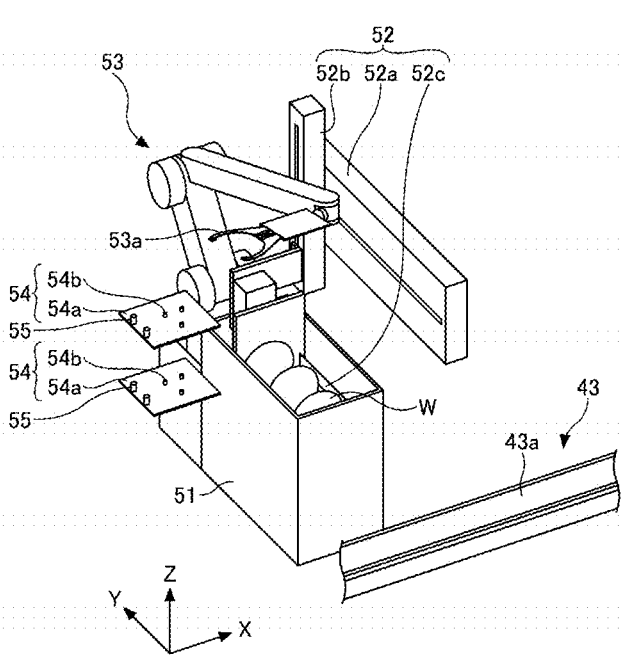
FIG. 3 is a schematic perspective view (2) illustrating the second interface section.

Referring to FIG. 1 to FIG. 3, a substrate processing system according to an exemplary embodiment will be described. As depicted in FIG. 1, the substrate processing system 1 has a carry-in/out section 2, a first interface section 3, a batch processing section 4, a second interface section 5, a single-substrate processing section 6, and a control device 9.

The carry-in/out section 2 serves as both a carry-in section and a carry-out section. This allows the substrate processing system 1 to be compact-sized. The carry-in/out section 2 has a load port 21, a stocker 22, a loader 23, and a cassette transfer device 24.

The load port 21 is disposed on the negative X-axis side of the carry-in/out section 2. A plurality of (e.g., four) load ports 21 are disposed along the Y-axis direction. However, the number of the load ports 21 is not particularly limited. A cassette C is placed on the load port 21. The cassette C accommodates therein a plurality of (e.g., 25 sheets of) substrates W, and is carried to/from the load port 21. In the cassette C, the substrates W are held horizontally, and are arranged in a vertical direction at a second pitch P2 (P2=N× P1) that is N times a first pitch P1. Here, N is a natural number equal to or greater than 2. In the present exemplary embodiment, N is 2, but it may be three or more.

The stocker 22 is plural in number (for example, four), and they are arranged along the Y-axis direction at the center of carry-in/out section 2 in the X-axis direction. A plurality of (e.g., two) stockers 22 are arranged adjacent to the first interface section 3 along the Y-axis direction on the positive X-axis side of the carry-in/out section 2. The stockers 22 may be arranged in multiple levels in the vertical direction. The stockers 22 temporarily store therein the cassette C accommodating the substrates W before being subjected to cleaning, the empty cassette C from which the substrates W have been taken out, and so forth. The number of the stockers 22 is not particularly limited.

The loader 23 is positioned adjacent to the first interface section 3, and is disposed on the positive X-axis side of the carry-in/out section 2. The cassette C is placed on the loader 23. The loader 23 is provided with a cover opening/closing mechanism (not shown) for opening and closing a cover of the cassette C. The loader 23 may be plural in number. In this case, the loaders 23 may be arranged in multiple levels in the vertical direction.

The cassette transfer device 24 is, for example, a multi-joint transfer robot. The cassette transfer device 24 is configured to transfer the cassette C between the load port 21, the stocker 22, and the loader 23.

The first interface section 3 is disposed on the positive X-axis side of the carry-in/out section 2. The first interface section 3 transfers the substrate W between the carry-in/out section 2, the batch processing section 4, and the single-substrate processing section 6. The first interface section 3 has a substrate moving/placing device 31, a lot forming device 32, and a first delivery table 33.

The substrate moving/placing device 31 is configured to transfer the substrate W between the cassette C placed on the loader 23, the lot forming device 32, and the first delivery table 33. The substrate moving/placing device 31 is configured by a multi-axis (for example, six-axis) arm robot, and has a substrate holding arm 31a at a leading end thereof. The substrate holding arm 31a has a plurality of holding claws (not shown) capable of holding a plurality of (e.g., 25 sheets of) substrates W. The substrate holding arm 31a can take any position and any posture in a three-dimensional space while holding the substrates W with the holding claws.

The lot forming device 32 is disposed on the positive X-axis side of the first interface section 3. The lot forming device 32 holds a multiple number of substrates W at the first pitch P1 to form a lot L.

The first delivery table 33 is adjacent to the single-substrate processing section 6, and is disposed on the positive Y-axis side of the first interface section 3. The first delivery table 33 receives the substrate W from a fourth transfer device 61 and temporarily stores the received substrate W thereon until it is handed over to the carry-in/out section 2.

The batch processing section 4 is disposed on the positive X-axis side of the first interface section 3. That is, the carry-in/out section 2, the first interface section 3, and the batch processing section 4 are disposed in this order from the negative X-axis side toward the positive X-axis side. The batch processing section 4 collectively processes the lot L which includes a multiple number of (e.g., 50 or 100 sheets of) substrates W at the first pitch P1. The single lot L is composed of substrates W of, for example, M cassettes C. M is a natural number equal to or greater than 2. M may be the same number as N, or may be a different number. The batch processing section 4 has a chemical liquid tub 41, a rinse liquid tub 42, a first transfer device 43, a handling tool 44, and a driving device 45.

The chemical liquid tub 41 and the rinse liquid tub 42 are arranged along the X-axis direction. For example, the chemical liquid tub 41 and the rinse liquid tub 42 are arranged in this order from the positive X-axis side toward the negative X-axis side. The chemical liquid tub 41 and the rinse liquid tub 42 are also collectively referred to as a processing tub. The number of the chemical liquid tub 41 and the rinse liquid tub 42 is not limited to the example shown in FIG. 1. For example, although a single set of chemical liquid tub 41 and rinse liquid tub 42 is provided in FIG. 1, multiple sets may be provided.

The chemical liquid tub 41 stores therein a chemical liquid in which the lot L is to be immersed. The chemical liquid is, by way of non-limiting example, a phosphoric acid aqueous solution ($H_3PO_4$). The phosphoric acid aqueous solution selectively etches and removes a silicon nitride film among a silicon oxide film and the silicon nitride film. The chemical liquid is not limited to the phosphoric acid aqueous solution. For example, it may be DHF (dilute hydrofluoric acid), BHF (a mixture of hydrofluoric acid and ammonium fluoride), dilute sulfuric acid, SPM (a mixture of sulfuric acid, hydrogen peroxide, and water), SC1 (a mixture of ammonia, hydrogen peroxide, and water), SC2 (a mixture of hydrochloric acid, hydrogen peroxide, and water), TMAH (a mixture of tetramethylammonium hydroxide and water), a plating liquid, or the like. The chemical liquid may be one for peeling or plating. The number of the chemical liquid(s) is not particularly limited, and a plurality of chemical liquids may be used.

The rinse liquid tub 42 stores therein a first rinse liquid in which the lot L is to be immersed. The first rinse liquid is pure water that removes the chemical liquid from the substrate W. For example, it may be DIW (deionized water).

The first transfer device 43 has a guide rail 43a and a first transfer arm 43b. The guide rail 43a is disposed on the further negative Y-axis side than the processing tub. The guide rail 43a extends in a horizontal direction (X-axis direction) from the first interface section 3 to the batch processing section 4. The first transfer arm 43b is configured to move in the horizontal direction (X-axis direction) along the guide rail 43*a*. The first transfer arm 43*b* may move in a vertical direction or rotate around a vertical axis. The first transfer arm 43*b* transfers the lot L at once between the first interface section 3 and the batch processing section 4.

The handling tool 44 receives the lot L from the first transfer arm 43*b*, and holds it. The handling tool 44 holds the multiple number of substrates W at the first pitch P1 in the Y-axis direction, and holds each of the substrates W vertically.

The driving device 45 is configured to move the handling tool 44 in the X-axis direction and the Z-axis direction. The handling tool 44 immerses the lot L in the chemical liquid stored in the chemical liquid tub 41, then immerses the lot L in the first rinse liquid stored in the rinse liquid tub 42, and then hands the lot L over to the first transfer device 43.

In the present exemplary embodiment, one set of handling tool 44 and driving device 45 is provided. However, multiple sets may be provided. In the latter case, one set may immerse the lot L in the chemical liquid stored in the chemical liquid tub 41, and another set may immerse the lot L in the first rinse liquid stored in the rinse liquid tub 42. In this case, the driving device 45 only needs to move the handling tool 44 in the Z-axis direction, and does not need to move the handling tool 44 in the X-axis direction.

The second interface section 5 is disposed on the positive Y-axis side of the batch processing section 4. The second interface section 5 transfers the substrate W between the batch processing section 4 and the single-substrate processing section 6. The second interface section 5 has an immersion tub 51, a second transfer device 52, a third transfer device 53, a second delivery table 54, and a pressing member 55.

The immersion tub 51 is disposed outside the movement range of the first transfer arm 43*b*. For example, the immersion tub 51 is disposed at a position shifted to the positive Y-axis side with respect to the processing tub. The immersion tub 51 stores therein a second rinse liquid in which the lot L is to be immersed. The second rinse liquid is, for example, DIW (deionized water). The substrate W is kept in the second rinse liquid until it is lifted up from the second rinse liquid by the third transfer device 53. Since the substrate W exists below the liquid level of the second rinse liquid, a surface tension of the second rinse liquid does not act on the substrate W, so a collapse of an irregularity pattern of the substrate W can be suppressed. The immersion tub 51 may be configured to be movable in the X-axis direction. In this case, when the lot L is immersed in the immersion tub 51, a positional deviation between the immersion tub 51 and the lot L in the X-axis direction can be corrected. An X-axis driving device (not shown) for moving the immersion tub 51 in the X-axis direction is mounted to, for example, a bottom surface of the immersion tub 51.

The second transfer device 52 has a Y-axis driving device 52*a*, a Z-axis driving device 52*b*, and a second transfer arm 52*c*.

The Y-axis driving device 52*a* is disposed on the positive X-axis side of the second interface section 5. The Y-axis driving device 52*a* extends horizontally (in the Y-axis direction) from the second interface section 5 to the batch processing section 4. The Y-axis driving device 52*a* moves the Z-axis driving device 52*b* and the second transfer arm 52*c* in the Y-axis direction. The Y-axis driving device 52*a* may include a ball screw. The Y-axis driving device 52*a* is an example of a horizontal driving device.

The Z-axis driving device 52*b* is movably mounted to the Y-axis driving device 52*a*. The Z-axis driving device 52*b* is configured to move the second transfer arm 52*c* in the Z-axis direction. The Z-axis driving device 52*b* may include a ball screw. The Z-axis driving device 52*b* is an example of a vertical driving device.

The second transfer arm 52*c* is movably mounted to the Z-axis driving device 52*b*. The second transfer arm 52*c* is configured to hold a multiple number of substrates W at a regular distance therebetween. The second transfer arm 52*c* receives the lot L from the first transfer arm 43*b* and holds it. The second transfer arm 52*c* holds the multiple number of substrates W at the first pitch P1 in the Y-axis direction. The second transfer arm 52*c* holds each of the multiple number of substrates W in a vertical posture. The second transfer arm 52*c* is an example of a vertical holder. The second transfer arm 52*c* is moved in the Y-axis direction and the Z-axis direction by the Y-axis driving device 52*a* and the Z-axis driving device 52*b*. The second transfer arm 52*c* is configured to be movable between multiple positions including a delivery position, an immersion position, and a standby position. The second transfer arm 52*c* may be configured to be movable in the X-axis direction. In this case, when the lot L is immersed in the immersion tub 51, the positional deviation between the immersion tub 51 and the lot L in the X-axis direction can be corrected. An X-axis driving device (not shown) for moving the second transfer arm 52*c* in the X-axis direction is movably mounted to, for example, the Z-axis driving device 52*b*. In this case, the second transfer arm 52*c* is movably mounted to the X-axis driving device.

The delivery position is a position where the lot L is handed over between the first transfer arm 43*b* and the second transfer arm 52*c*. The delivery position is a position on the negative Y-axis and positive Z-axis side.

The immersion position is a position where the lot L is immersed in the immersion tub 51. The immersion position is a position on the positive Y-axis and negative Z-axis side with respect to the delivery position.

The standby position is a position where the second transfer arm 52*c* stands by when neither the delivery of the lot L nor the immersion of the lot L in immersion tub 51 is being performed. The standby position is directly below the delivery position (negative Z-axis side thereof) and is a position where the second transfer arm 52*c* does not impede the movement of the first transfer arm 43*b*. In this case, as the second transfer arm 52*c* can be moved to the delivery position only by being moved upwards (toward the positive Z-axis side), throughput can be improved. The standby position may be the same position as the immersion position. In this case, it is possible to suppress particles that may be generated due to the operation of the first transfer device 43 from adhering to the second transfer arm 52*c*. The standby position may be a position directly above the immersion position (positive Z-axis side thereof). In this way, by setting the standby position to the position different from the delivery position, the first transfer arm 43*b* and the second transfer arm 52*c* can be suppressed from coming into contact with each other.

The second transfer device 52 moves the second transfer arm 52*c* to the immersion position or the standby position while the first transfer device 43 is being operated. In this case, a contact between the first transfer arm 43*b* and the second transfer arm 52*c* can be suppressed.

The third transfer device 53 is configured by a multi-axis (e.g., six-axis) arm robot. The third transfer device 53 has a third transfer arm 53*a* at a leading end thereof. The third transfer arm 53*a* is configured to hold the substrate W. The third transfer arm 53*a* can take any position and any posture in a three-dimensional space while holding the substrate W.

The third transfer device 53 transfers the substrate W between the second transfer arm 52c located at the immersion position and the second delivery table 54. Specifically, as shown in FIG. 2, the third transfer arm 53a first receives the substrate W in the vertical posture that is held by the second transfer arm 52c located at the immersion position. Next, as illustrated in FIG. 3, the third transfer arm 53a turns the substrate W from the vertical posture to a horizontal posture. Subsequently, the third transfer arm 53a delivers the substrate W in the horizontal posture to the second delivery table 54. At this time, since the immersion tub 51 is disposed outside the movement range of the first transfer arm 43b, the first transfer arm 43b and the third transfer arm 53a do not interfere with each other. This allows one of the first transfer device 43 and the third transfer device 53 to be operated independently of an operational status of the other. Therefore, the first transfer device 43 and the third transfer device 53 can be operated at any timing, so that the time required for the transfer of the substrate W can be shortened. As a result, productivity of the substrate processing system 1 is improved.

The second delivery table 54 is adjacent to the single-substrate processing section 6 and is disposed on the negative X-axis side of the second interface section 5. The second delivery table 54 receives the substrate W from the third transfer devices 53, and temporarily stores the received substrate W thereon until it is delivered to the single-substrate processing section 6. The substrate W taken out of the immersion tub 51 is placed on the second delivery table 54. The second delivery table 54 holds the substrate W horizontally. The second delivery table 54 is an example of a horizontal holder. Desirably, the substrate W placed on the second delivery table 54 is in a state where its surface is wet with the second rinse liquid, for example. In this case, the surface tension of the second rinse liquid does not act on the substrate W, so that the collapse of the irregularity pattern of the substrate W can be suppressed. The second delivery table 54 may be plural in number, and they may be arranged in multiple levels (for example, two levels) in the vertical direction.

The second delivery table 54 has a placement plate 54a and three pins 54b. The placement plate 54a has, for example, a rectangular plate shape. Alternatively, the placement plate 54a may have a circular plate shape. The pins 54b are provided on the placement plate 54a. In the present exemplary embodiment, the number of the pins 54b is three, but more than three pins 54b may be provided. The three pins 54b are arranged to form an equilateral triangle when viewed from the top. The pins 54b support the substrate W from below on the placement plate 54a.

The pressing member 55 is provided for each second delivery table 54. The pressing member 55 is disposed on each placement plate 54a on the negative X-axis side of the placement plate 54a. In this case, a moving distance of the third transfer arm 53a from a position where it presses the substrate W against the pressing member 55 to a position where it hands the substrate W over to the second delivery table 54 is shortened. However, the position where the pressing member 55 is provided is not limited thereto. The pressing member 55 may be provided at any of various positions as long as the third transfer arm 53a can access it. For example, the pressing member 55 may be disposed between the second delivery tables 54 adjacent in the vertical direction to be located on the positive X-axis side of these second delivery tables 54. In this case, as compared to the case where the pressing member 55 is provided for each of the second delivery tables 54, the number of the pressing members 55 can be reduced. The pressing member 55 comes into contact with the substrate W held by the third transfer arm 53a, and move the substrate W horizontally with respect to the third transfer arm 53a.

The single-substrate processing section 6 is disposed on the negative X-axis side of the second interface section 5 and the positive Y-axis side of the carry-in/out section 2, the first interface section 3, and the batch processing section 4. The single-substrate processing section 6 processes the substrates W one by one. The single-substrate processing section 6 has the fourth transfer device 61, a liquid processing apparatus 62, and a drying apparatus 63.

The fourth transfer device 61 has a guide rail 61a and a fourth transfer arm 61b. The guide rail 61a is disposed on the negative Y-axis side of the single-substrate processing section 6. The guide rail 61a extends in a horizontal direction (X-axis direction) in the single-substrate processing section 6. The fourth transfer arm 61b moves in the horizontal direction (X-axis direction) along the guide rail 61a and a vertical direction, and also rotates around a vertical axis. The fourth transfer arm 61b transfers the substrate W between the second delivery table 54, the liquid processing apparatus 62, the drying apparatus 63, and the first delivery table 33. The number of the fourth transfer arm 61b may be one or more, and in the latter case, the fourth transfer device 61 transfers a plurality of (e.g., five) substrates W at once.

The liquid processing apparatus 62 is disposed on the positive X-axis side and positive Y-axis side of the single-substrate processing section 6. The liquid processing apparatus 62 is of a single substrate type, and it processes the substrates W one by one with a processing liquid. The liquid processing apparatus 62 is plural in number, and they are arranged in multiple levels (e.g., three levels) in the vertical direction (Z-axis direction). This allows a plurality of substrates W to be processed simultaneously with the processing liquid. The processing liquid may be plural in number. For example, pure water such as DIW, and a drying liquid having a lower surface tension than pure water may be used. The drying liquid may be, by way of non-limiting example, alcohol such as IPA (isopropyl alcohol).

The drying apparatus 63 is disposed adjacent to the liquid processing apparatus 62 on the negative X-axis side thereof. In this case, an end face of the single-substrate processing section 6 on the positive Y-axis side may be disposed so as to be on a level with or on a substantially level with an end face of the second interface section 5 on the positive Y-axis side. This results in almost no dead space, so that the footprint of the substrate processing system 1 can be made small. In contrast, if the drying apparatus 63 is disposed adjacent to the liquid processing apparatus 62 on the positive Y-axis side thereof, the end face of the single-substrate processing section 6 on the positive Y-axis side may protrude more than the end face of the second interface section 5 on the positive Y-axis side, resulting in the dead space. The drying apparatus 63 is of a single substrate type, and dries the substrates W one by one with a supercritical fluid. The drying apparatus 63 is plural in number, and they are arranged in multiple levels (e.g., three levels) in the vertical direction. With this configuration, the multiple substrates W can be dried simultaneously.

Here, both the liquid processing apparatus 62 and the drying apparatus 63 do not need to be of the single substrate type, and the liquid processing apparatus 62 may be of the single substrate type while the drying apparatus 63 is of a batch type. The drying apparatus 63 may dry a plurality of substrates W collectively with the supercritical fluid. The number of the substrates W collectively processed in the drying apparatus 63 may be equal to or more than the number of the substrates W collectively processed in the liquid processing apparatus 62, but may be less than that. An apparatus other than the liquid processing apparatus 62 and the drying apparatus 63 may be disposed in the single-substrate processing section 6.

The control device 9 is, for example, a computer. The control device 9 includes a CPU (Central Processing Unit) 91 and a recording medium 92 such as a memory. The recording medium 92 stores a program that controls various processes performed in the substrate processing system 1. The control device 9 controls the operation of the substrate processing system 1 by causing the CPU 91 to execute the program stored in the recording medium 92. The control device 9 includes an input interface 93 and an output interface 94. The control device 9 receives a signal from the outside through the input interface 93 and transmits a signal to the outside through the output interface 94.

The aforementioned program is stored, for example, in a computer-readable recording medium, and is installed from that recording medium into the recording medium 92 of the control device 9. The computer-readable recording medium may be, by way of non-limiting example, a hard disk (HD), a flexible disk (FD), a compact disk (CD), a magnet optical disk (MO), a memory card, or the like. The program may also be downloaded from a server via the Internet and installed into the recording medium 92 of the control device 9.

In the substrate processing system 1, the substrate W is transferred from the carry-in/out section 2 to the first interface section 3, the batch processing section 4, the second interface section 5, and the single-substrate processing section 6 in this order, and is then returned back to the carry-in/out section 2.

[Operation of Substrate Processing System]

Referring to FIG. 4, the operation of the substrate processing system 1 according to the exemplary embodiment, that is, a substrate processing method will be explained. Processes shown in FIG. 4 are performed under the control of the control device 9.

First, the cassette C accommodating the plurality of substrates W is carried into the carry-in/out section 2 and placed on the load port 21. In the cassette C, the substrates W are held horizontally and vertically arranged at the second pitch P2 (P2=N×P1). N is a natural number equal to or greater than 2. In the present exemplary embodiment, N is 2, but it may be 3 or more.

Next, the cassette transfer device 24 transfers the cassette C from the load port 21 to the loader 23. The cover of the cassette C transferred to the loader 23 is opened by the cover opening/closing mechanism.

Next, the substrate moving/placing device 31 receives the substrates accommodated in the cassette C (S101 in FIG. 4), and transfers the received substrates W to the lot forming device 32.

Then, the lot forming device 32 holds a multiple number of substrates W at the first pitch P1 (P1=P2/N) to form the lot L (S102 in FIG. 4). The single lot L is composed of substrates W in, for example, M cassettes C. Since the pitch of the substrates W is reduced from the second pitch P2 to the first pitch P1, the number of the substrates W to be processed at one time can be increased.

Next, the first transfer device 43 receives the lot L from the lot forming device 32 and transfers it to the handling tool 44.

Then, the handling tool 44 descends from above the chemical liquid tub 41, immerses the lot L in the chemical liquid, and performs a chemical liquid process (S103 of FIG. 4). Thereafter, the handling tool 44 rises to lift up the lot L from the chemical liquid, and then is moved horizontally (in the negative X-axis direction) toward above the rinse liquid tub 42.

Subsequently, the handling tool 44 descends from above the rinse liquid tub 42, immerses the lot L in the first rinse liquid, and performs a rinse liquid process (S103 of FIG. 4). Thereafter, the handling tool 44 ascends to lift up the lot L out of the first rinse liquid. Then, the first transfer device 43 receives the lot L from the handling tool 44, and transfers it to the second transfer device 52.

Next, the second transfer arm 52*c* of the second transfer device 52 is moved horizontally (in the positive Y-axis direction) and lowered from above the immersion tub 51 to immerse the lot L in the second rinse liquid (S104 of FIG. 4). The substrates W of the lot L are maintained in the second rinse liquid until they are lifted up from the second rinse liquid by the third transfer device 53. Since the substrates W are present below the liquid level of the second rinse liquid, the surface tension of the second rinse liquid does not act on the substrates W, so that a collapse of the irregularity pattern of the substrates W can be suppressed.

Thereafter, the third transfer device 53 transfers the substrates W of the lot L held by the second transfer arm 52*c* in the second rinse liquid to the second delivery table 54. The third transfer device 53 transfers the substrates W one by one to the second delivery table 54.

Next, the fourth transfer device 61 receives the substrate W from the second delivery table 54, and transfers them to the liquid processing apparatus 62.

Then, the liquid processing apparatus 62 processes the substrates W one by one with a liquid (S105 of FIG. 4). The liquid may be plural in number, and these liquids may be, by way of non-limiting example, pure water such as DIW and a drying liquid having a lower surface tension than the pure water. The drying liquid may be, for example, alcohol such as IPA. The liquid processing apparatus 62 supplies the pure water and the drying liquid in this order onto the top surface of the substrate W to form a liquid film of the drying liquid.

Subsequently, the fourth transfer device 61 receives the substrate W from the liquid processing apparatus 62, and holds the substrate W horizontally with their liquid films of the drying liquid facing upwards. The fourth transfer device 61 then transfers the substrate W from the liquid processing apparatus 62 to the drying apparatus 63.

Afterwards, the drying apparatus 63 dries the substrates W one by one with a supercritical fluid (S105 of FIG. 4). The drying liquid may be replaced with the supercritical fluid so a collapse of the irregularity pattern of the substrate W due to the surface tension of the drying liquid can be suppressed. Since the supercritical fluid requires a pressure-resistant container, the drying process is performed as a single-substrate process rather than a batch process in order to size down the pressure-resistant container.

Although the drying apparatus 63 is of the single-substrate type in the present exemplary embodiment, it may be of a batch type as mentioned above. The batch type drying apparatus 63 dries the multiple substrates W having the liquid films all at once with the supercritical fluid. While the single-substrate type drying apparatus 63 has one transfer arm configured to hold the substrates W, the batch type drying apparatus 63 has multiple transfer arms.

Next, the fourth transfer device 61 receives the substrate W from the drying apparatus 63, and transfers them to the first delivery table 33.

Then, the substrate moving/placing device 31 receives the substrates W from the first delivery table 33 and stores them in the cassette C (S106 of FIG. 4). The cassette C accommodating the substrates W is carried out from the carry-in/out section 2.

[Third Transfer Arm]

Figure 5:
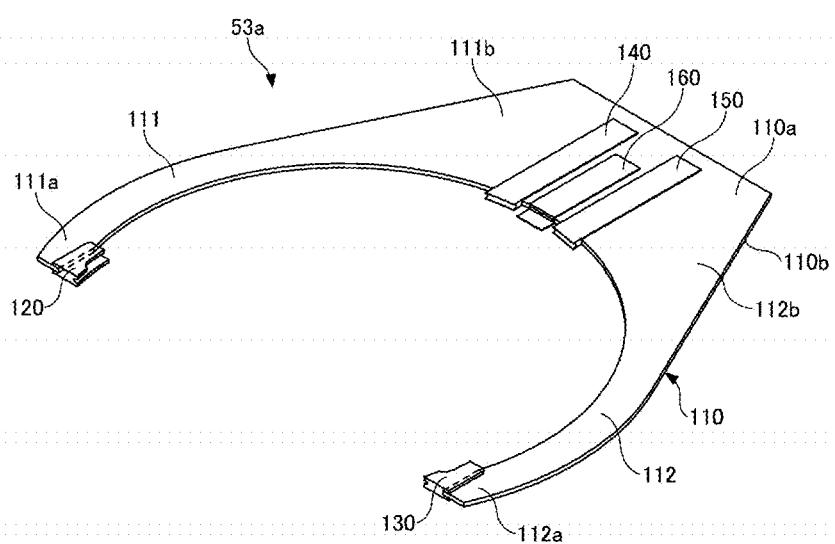
FIG. 5 is a perspective view illustrating a third transfer arm.
Figures 6A, 6B, 6C:
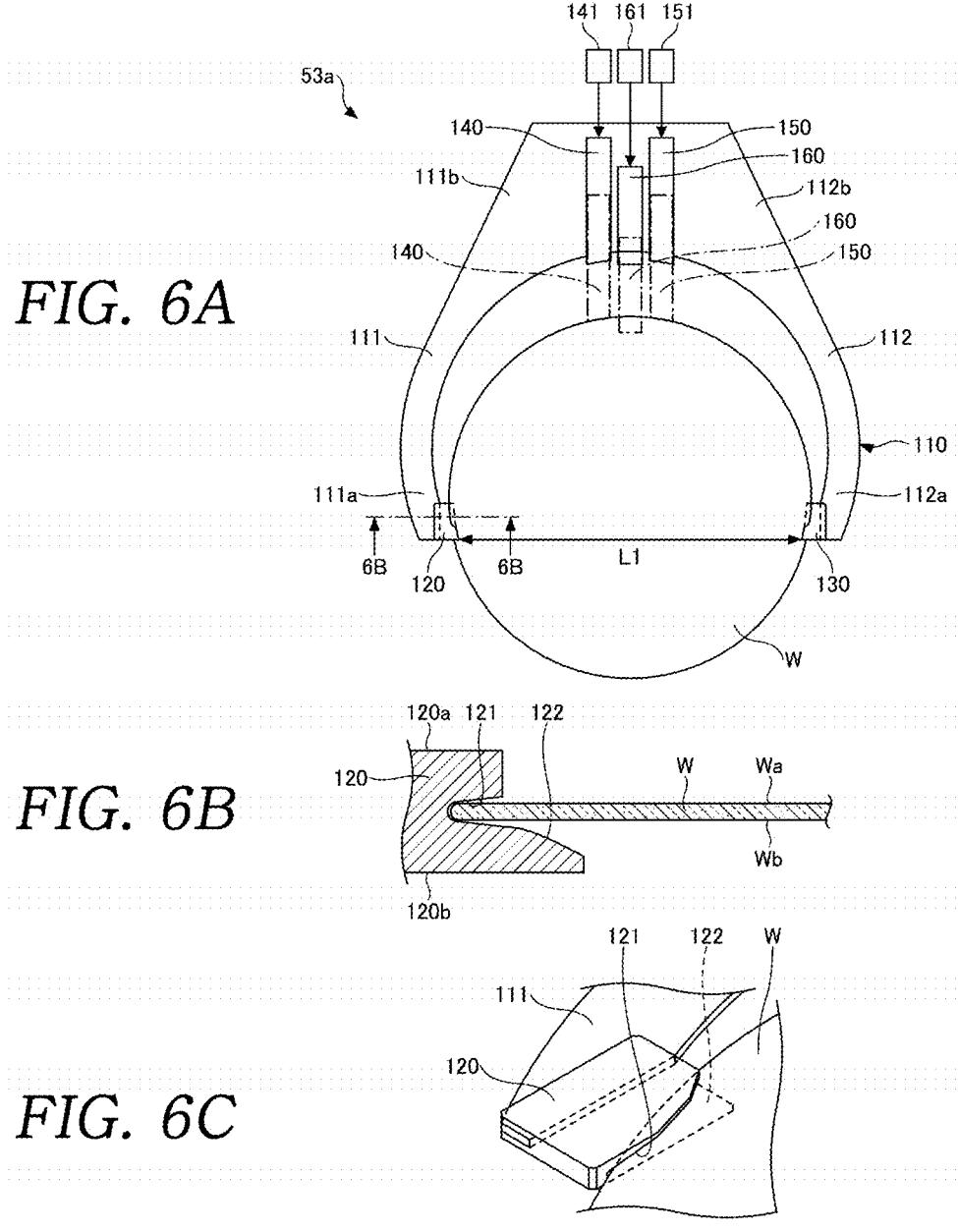
FIG. 6A to FIG. 6C are diagrams for describing an end holding position.
Figures 7A, 7B, 7C:
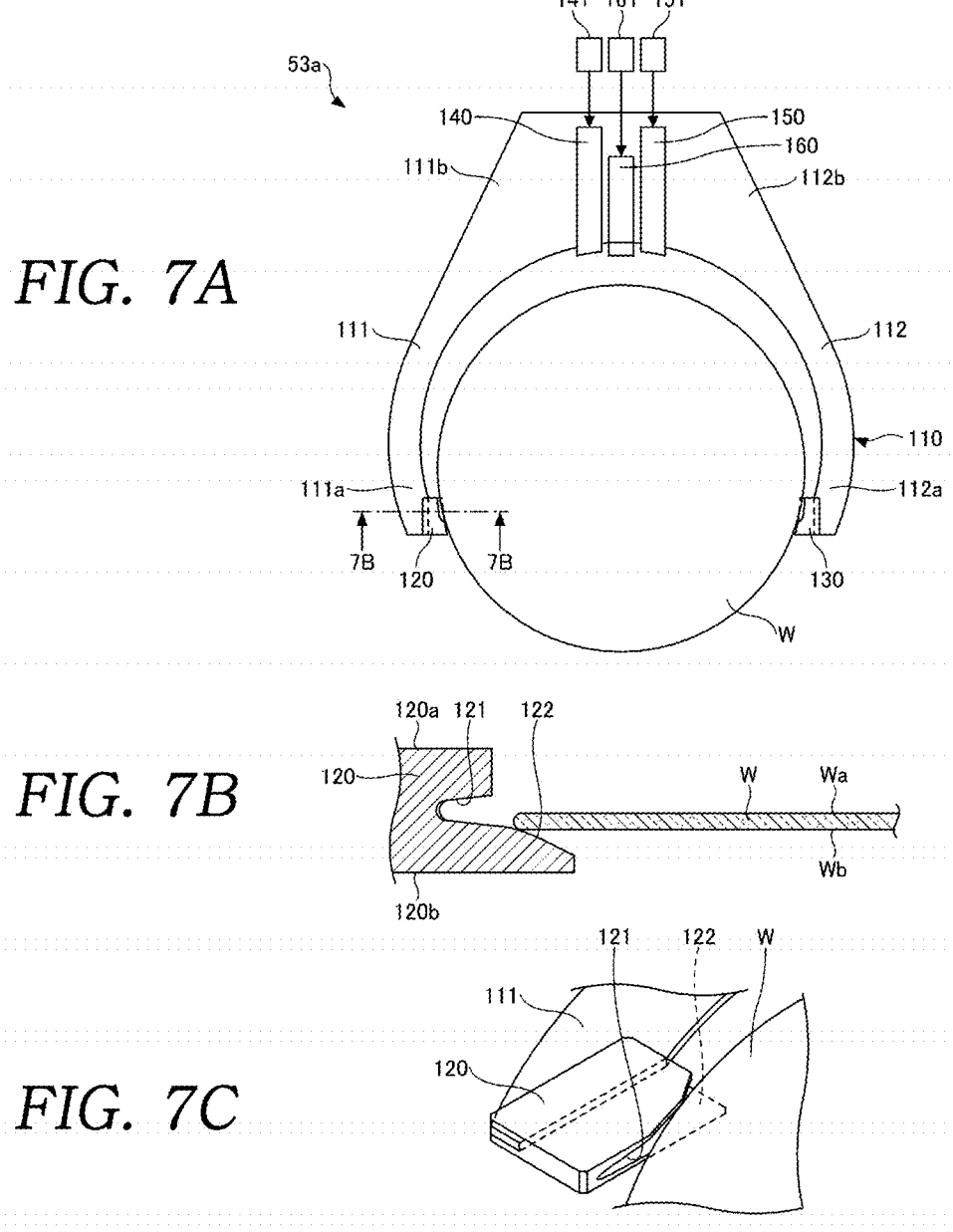
FIG. 7A to FIG. 7C are diagrams for describing a rear surface holding position.
Figures 8A, 8B:
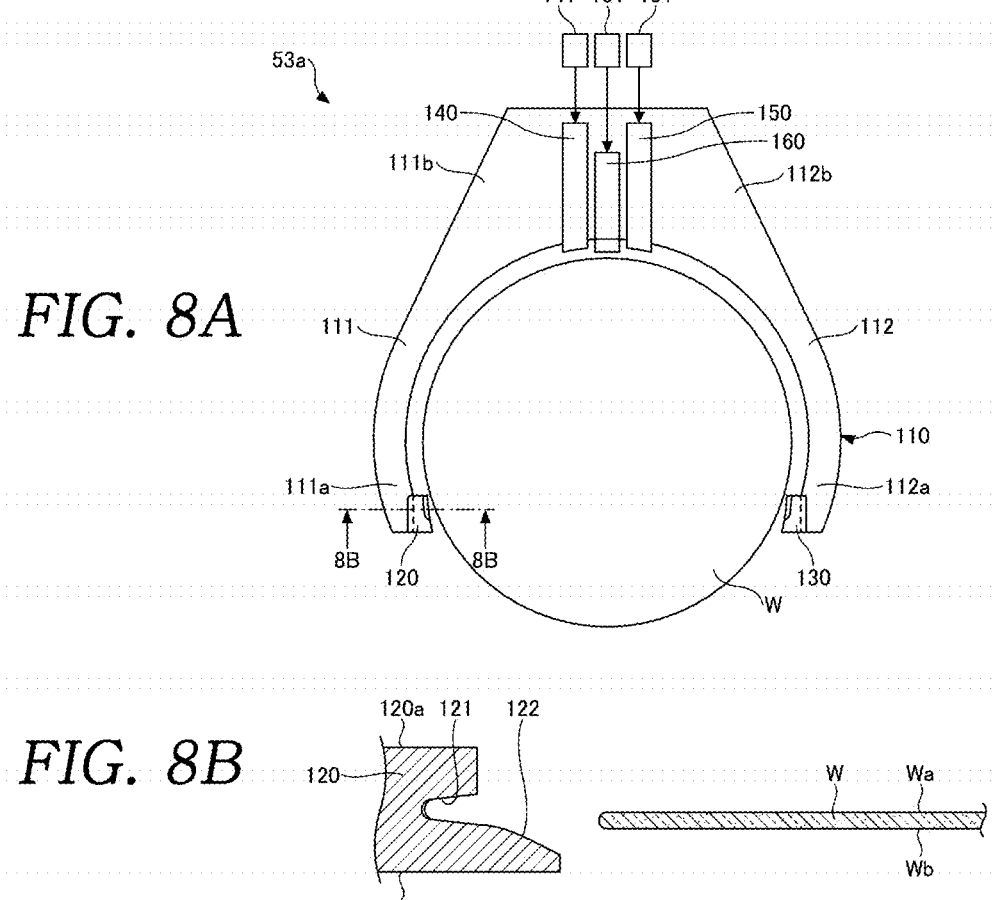
FIG. 8A and FIG. 8B are diagrams for describing a substrate passing position.

Referring to FIG. 5 to FIG. 8B, the third transfer arm 53a will be described. FIG. 5 is a perspective view illustrating the third transfer arm 53a. FIG. 6A to FIG. 6C are diagrams for describing an end holding position. FIG. 6A is a plan view seen from a direction perpendicular to the front surface Wa of the substrate W. FIG. 6B is a cross sectional view taken along an arrow 6B-6B in FIG. 6A. FIG. 6C is an enlarged perspective view showing a first holding guide 120. FIG. 7A to FIG. 7C are diagrams for describing a rear surface holding position. FIG. 7A is a plan view seen from a direction perpendicular to the front surface Wa of the substrate W. FIG. 7B is a cross sectional view taken along an arrow 7B-7B in FIG. 7A. FIG. 7C is an enlarged perspective view showing the first holding guide 120. FIG. 8A and FIG. 8B are diagrams for describing a substrate passing position. FIG. 8A is a plan view seen from a direction perpendicular to the front surface Wa of the substrate W. FIG. 8B is a cross sectional view taken along an arrow 8B-8B in FIG. 8A.

The third transfer arm 53a is an example of a substrate holder. The third transfer arm 53a has a main body 110, the first holding guide 120, a second holding guide 130, a first clamping member 140, a second clamping member 150, and a rear surface holding mechanism 160.

The main body 110 has a substantially U-shape. The main body 110 has a first surface 110a and a second surface 110b. The second surface 110b is the surface opposite to the first surface 110a. The main body 110 has a first arm 111 and a second arm 112. The first arm 111 includes a leading end 111a and a base end 111b. The second arm 112 includes a leading end 112a and a base end 112b. The leading end 111a of the first arm 111 and the leading end 112a of the second arm 112 are spaced apart from each other. The base end 111b of the first arm 111 and the base end 112b of the second arm 112 are connected to each other.

The first holding guide 120 is fixed to an inner side of the leading end 111a of the first arm 111. The first holding guide 120 is configured to hold a periphery of the substrate W. The first holding guide 120 has a first surface 120a and a second surface 120b. The second surface 120b is the surface opposite to the first surface 120a. The first holding guide 120 has a supporting groove 121 and a supporting surface 122. The supporting groove 121 supports the periphery of the substrate W from both the front surface side Wa and the rear surface Wb side of the substrate W. The supporting groove 121 widens from a bottom toward an opening thereof. In this case, the periphery of the substrate W can be easily put into the supporting groove 121. The supporting surface 122 is provided closer to the center of the substrate W than the supporting groove 121. The supporting surface 122 supports the periphery of the substrate W from the rear surface Wb side of the substrate W. The supporting surface 122 is inclined from the first surface 120a side toward the second surface 120b side as it goes away from the supporting groove 121.

The second holding guide 130 is fixed to an inner side of the leading end 112a of the second arm 112. The second holding guide 130 is configured to hold the periphery of the substrate W. The second holding guide 130 has a first surface 130a and a second surface 130b. The second surface 130b is the surface opposite to the first surface 130a. The second holding guide 130 has a supporting groove 131 and a supporting surface 132. The supporting groove 131 supports the periphery of the substrate W from both the front surface Wa side and the rear surface Wb side of the substrate W. The supporting groove 131 widens from a bottom toward an opening thereof. In this case, the periphery of the substrate W can be easily put into the supporting groove 131. The supporting surface 132 is provided closer to the center of the substrate W than the supporting groove 131. The supporting surface 132 supports the periphery of the substrate W from the rear surface Wb side of the substrate W. The supporting surface 132 is inclined from the first surface 130a side toward the second surface 130b side as it goes away from the supporting groove 131.

A length Li between the first holding guide 120 and the second holding guide 130 is shorter than the diameter of the substrate W. The diameter of the substrate W is, for example, 300 mm.

The first clamp member 140 is provided at the base end 111b. The first clamp member 140 is configured to be movable between a closing position (a position indicated by a dashed dotted line in FIG. 6A) where it clamps the periphery of the substrate W and an opening position (a position indicated by a solid line in FIG. 6A) where it releases the clamping of the substrate W. The first clamp member 140 is driven by a first cylinder 141.

The second clamp member 150 is provided at the base end 112b. The second clamp member 150 is configured to be movable between a closing position (a position indicated by a dashed dotted line in FIG. 6A) where it clamps the periphery of the substrate W and an opening position (a position indicated by a solid line in FIG. 6A) where it releases the clamping of the substrate W. The second clamp member 150 is driven by a second cylinder 151.

The rear surface holding mechanism 160 is provided at the base ends 111b and 112b. The rear surface holding mechanism 160 is provided between the first clamp member 140 and the second clamp member 150. The rear surface holding mechanism 160 is configured to be movable between a closing position (a position indicated by a dashed dotted line in FIG. 6A) where it holds the substrate W from the rear surface thereof and an opening position (a position indicated by a solid line in FIG. 6A) diametrically outside the substrate W. The rear surface holding mechanism 160 is driven by a cylinder 161.

The main body 110 is configured to be movable between the end holding position, the rear surface holding position, and the substrate passing position.

The end holding position is a position where the supporting groove 121 of the first holding guide 120 and the supporting groove 131 of the second holding guide 130 support the periphery of the substrate W from both the front surface Wa side and the rear surface Wb of the substrate W, as shown in FIG. 6A, FIG. 68, and FIG. 6C.

As illustrated in FIG. 7A, FIG. 7B, and FIG. 7C, the rear surface holding position is a position where the supporting surface 122 of the first holding guide 120 and the supporting surface 132 of the second holding guide 130 support the periphery of the substrate W from the rear surface Wb side of the substrate W. The rear surface holding position is a position where the base ends 111b and 112b of the main body 110 are located closer to the center of the substrate W than the end holding position by a first distance. The first distance is, for example, 10 mm to 20 mm. In the present exemplary embodiment, the first distance is 12 mm.

As shown in FIG. 8A and FIG. 88, the substrate passing position is a position where the first holding guide 120 and the second holding guide 130 do not hold the substrate W. The substrate passing position is a position where the base ends 111b and 112b of the main body 110 are located closer to the center of the substrate W than the rear surface holding position. The substrate passing position is a position where the base ends 111b and 112b of the main body 110 are located closer to the center of the substrate W than the end holding position by a second distance. The second distance is, for example, 20 mm to 40 mm. In the present exemplary embodiment, the second distance is 30 mm. At the substrate passing position, the first arm 111, the second arm 112, the first holding guide 120, and the second holding guide 130 are located diametrically outside the substrate W on the same plane as the main body 110. At the substrate passing position, when viewed from the top in a direction perpendicular to the front surface Wa of the substrate W, the first arm 111, the second arm 112, the first holding guide 120, and the second holding guide 130 do not overlap with the substrate W. Therefore, at the substrate passing position, the main body 110 can be moved in the direction perpendicular to the front surface Wa of the substrate W without coming into contact with the substrate W.

[Substrate Transfer Method]

A substrate transfer method of transferring the substrate W from the second transfer arm 52c to the second delivery table 54, in which the third transfer arm 53a receives the substrate W in the vertical posture held by the second transfer arm 52c, turns the substrate W from the vertical posture to the horizontal posture, and hands it over to the second delivery table 54, will be explained.

(Substrate Receiving Operation)

Referring to FIG. 9A to FIG. 13, an operation in which third transfer arm 53a receives the substrates W of the lot L held by the second transfer arm 52c in the second rinse liquid (hereinafter referred to as "substrate receiving operation") will be explained. The substrate receiving operation is performed under the control of the control device 9. As depicted in FIG. 9B, substrates W1 with their front surfaces Wa facing the positive Y-axis side and substrates W2 with their rear surfaces Wb facing the positive Y-axis side are alternately held at the second transfer arm 52c at the first pitch P1.

Figures 9A, 9B:
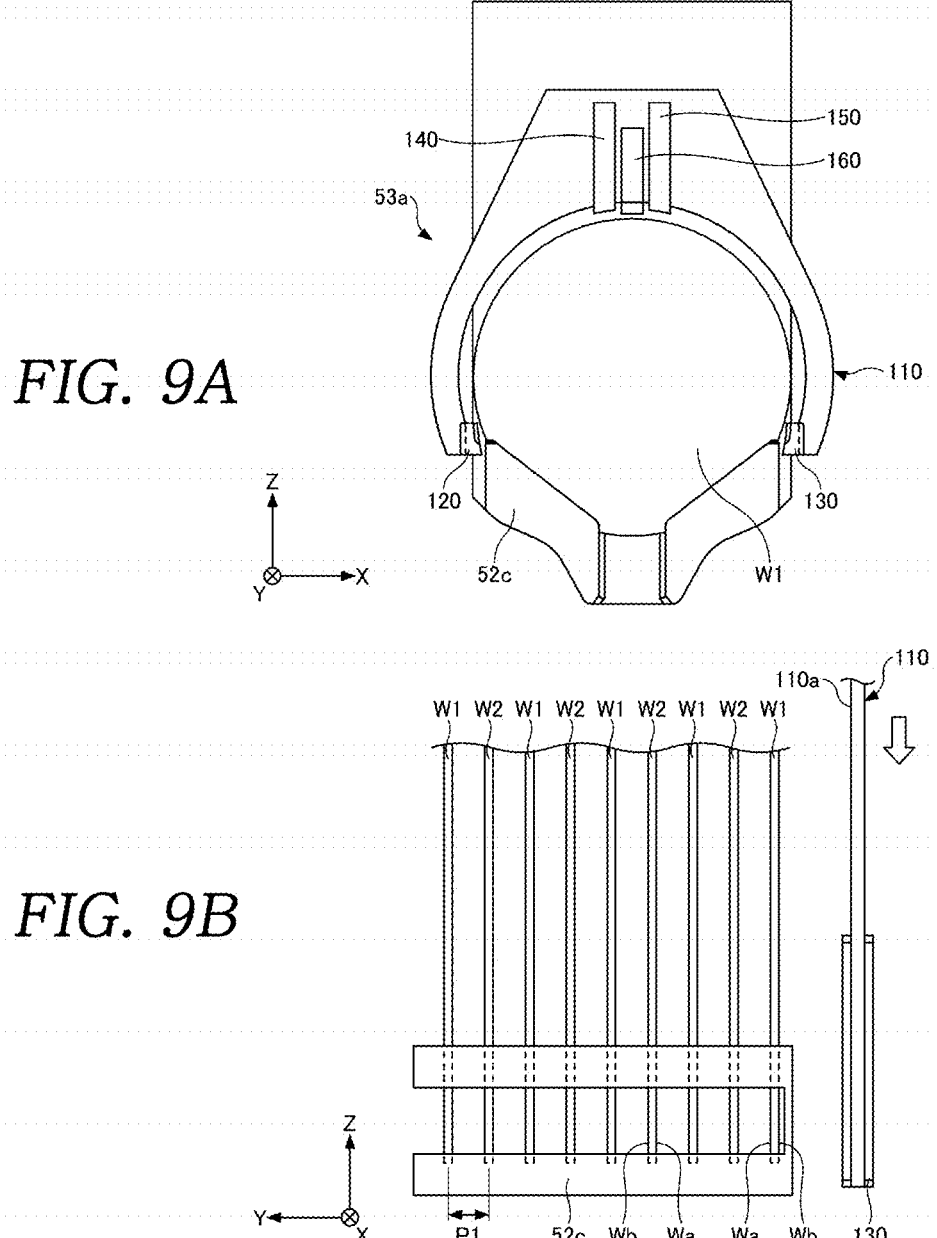
FIG. 9A and FIG. 9B are diagrams (1) illustrating a substrate receiving operation.

First, as shown in FIG. 9A and FIG. 9B, the main body 110 moves to the substrate passing position on the negative Y-axis side of the second transfer arm 52c, with its first surface 110a parallel to the front surfaces Wa and the rear surfaces Wb of the substrates W1 and W2.

Figures 10A, 10B:
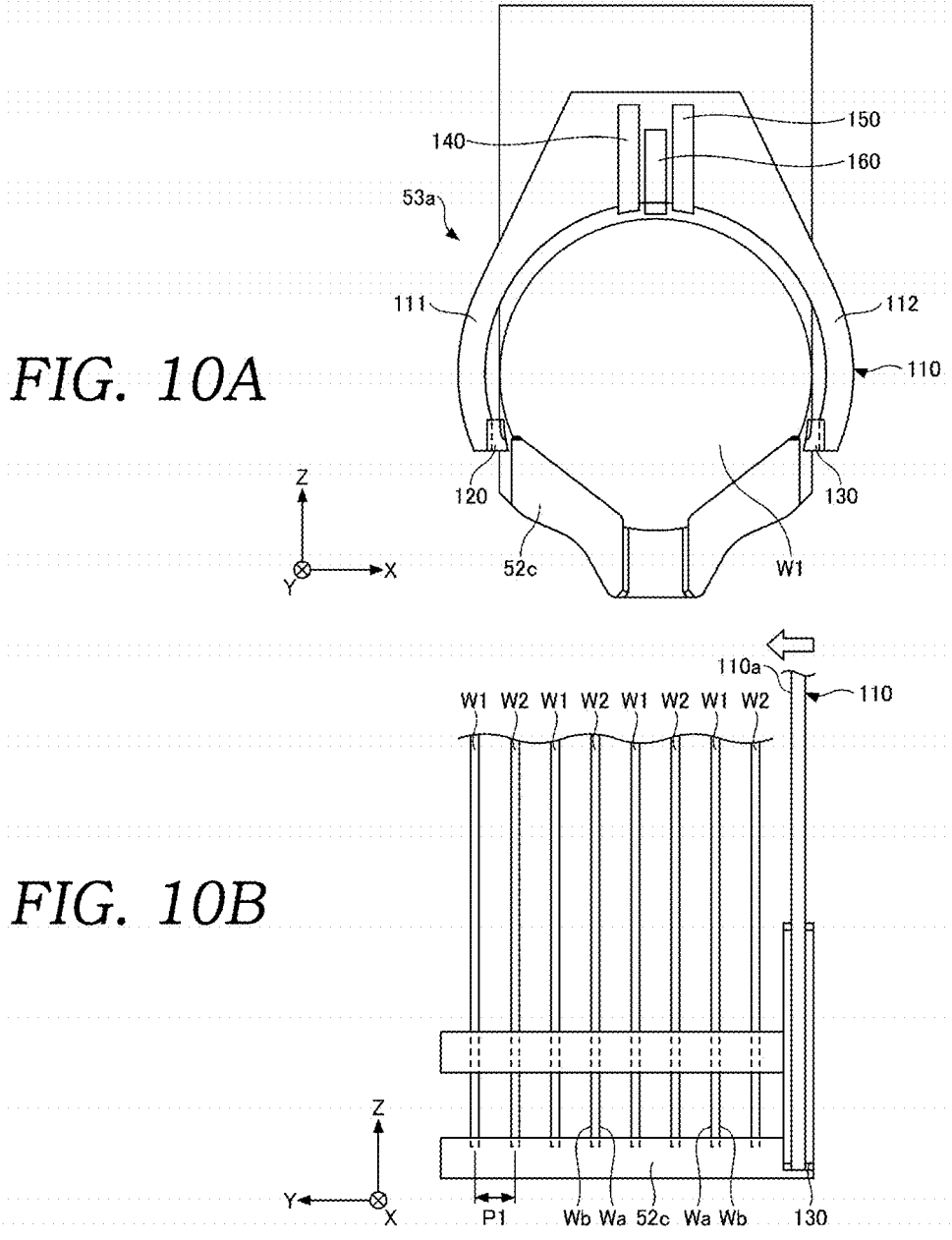
FIG. 10A and FIG. 10B are diagrams (2) illustrating the substrate receiving operation.

Next, as shown in FIG. 10A and FIG. 10B, the main body 110 moves in the positive Y-axis direction and stops at the same plane as the substrate W1 to be received. At the substrate passing position, the first arm 111, the second arm 112, the first holding guide 120, and the second holding guide 130 do not overlap with the substrates W1 and W2 when viewed from the plane in the Y-axis direction. Therefore, at the substrate passing position, the main body 110 can move horizontally in the positive Y-axis direction to the same plane as the substrate W1 to be received without coming into contact with the substrates W1 and W2.

Figures 11A, 11B:
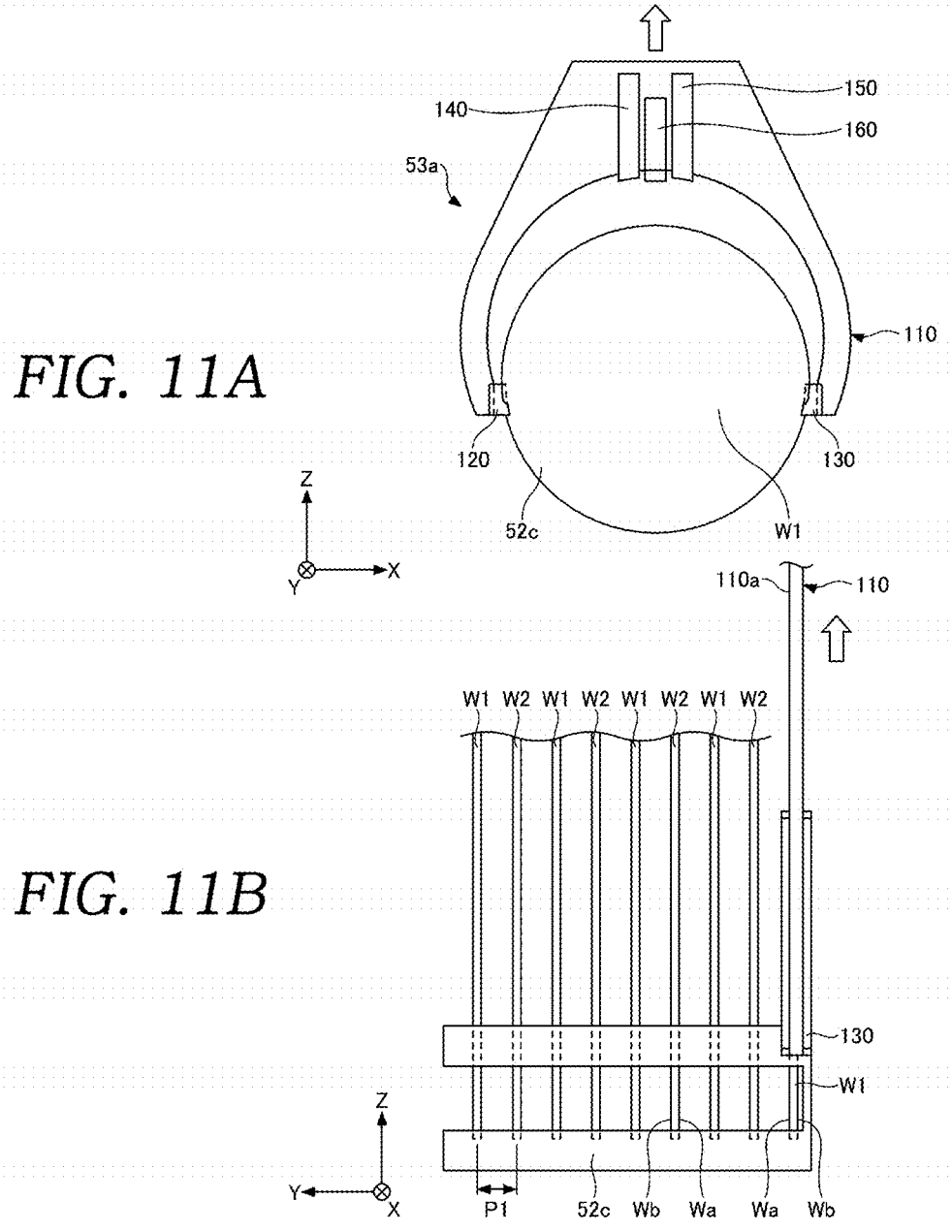
FIG. 11A and FIG. 11B are diagrams (3) illustrating the substrate receiving operation.

Then, as shown in FIG. 11A and FIG. 11B, the main body 110 moves in the positive Z-axis direction and stops at the end holding position, whereby the periphery of the substrate W1 is supported from both the front surface Wa side and the rear surface Wb side of the substrate W1 by the supporting groove 121 of the first holding guide 120 and the supporting groove 131 of the second holding guide 130.

Figure 12:
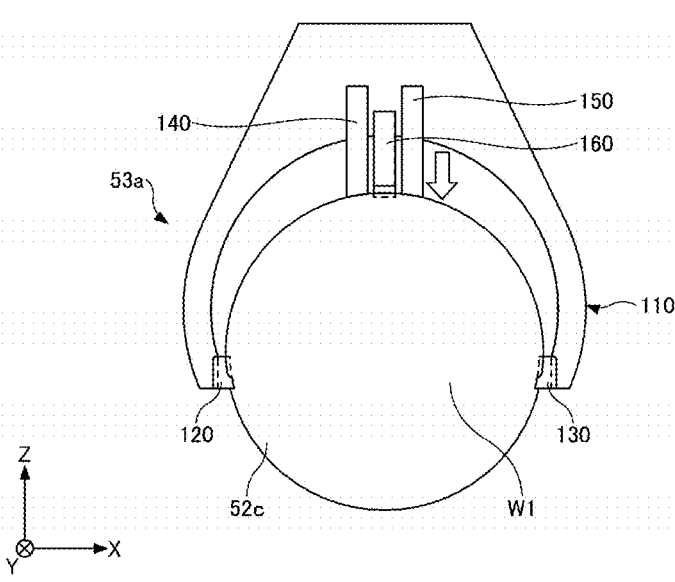
FIG. 12 is a diagram (4) illustrating the substrate receiving operation.

Next, as shown in FIG. 12, each of the first clamp member 140 and the second clamp member 150 moves from the opening position to the closing position, whereby the periphery of the substrate W1 is clamped by the first clamp member 140 and the second clamp member 150. Also, as shown in FIG. 12, the rear surface holding mechanism 160 moves from the opening position to the closing position.

Figure 13:
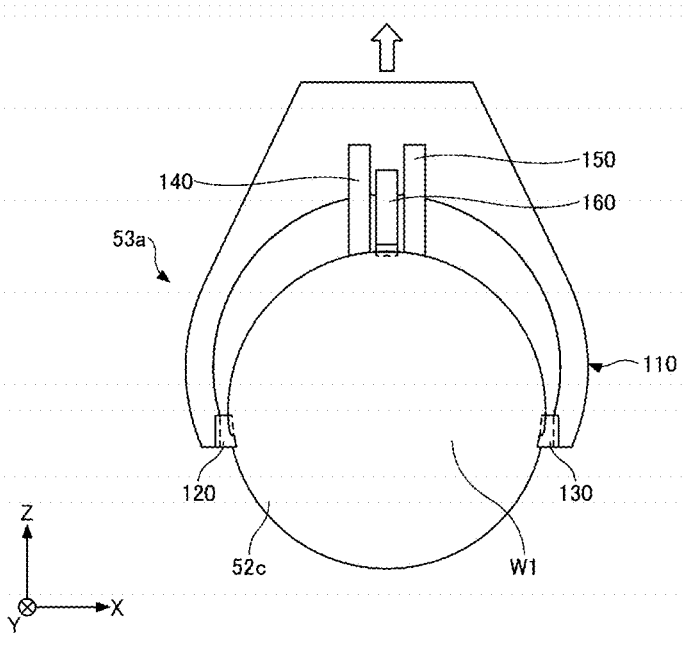
FIG. 13 is a diagram (5) illustrating the substrate receiving operation.

Subsequently, as shown in FIG. 13, the main body 110 moves in the positive Z-axis direction, whereby the third transfer arm 53a receives the substrate W1 held by the second transfer arm 52c.

Through the above-described operations, the substrate receiving operation for the single sheet of substrate W1 is completed. In the substrate receiving operation, the main body 110 moves in the positive Y-axis direction to a required position at the substrate passing position to selectively receive any of the substrates W1 and W2 of the lot L held by the second transfer arm 52c.

(Substrate Delivering Operation)

Referring to FIG. 14 to FIG. 18, an operation in which the third transfer arm 53a delivers the substrate W to the second delivery table 54 (hereinafter referred to as "substrate delivering operation") will be explained. The substrate delivering operation is performed under the control of the control device 9.

Figure 14:
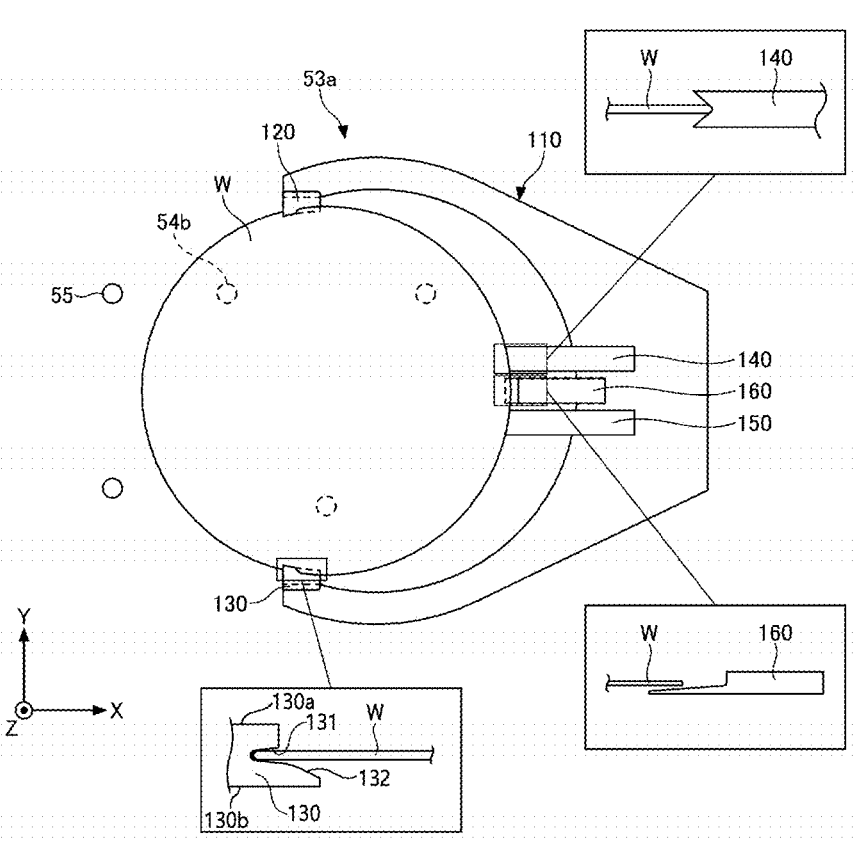
FIG. 14 is a diagram (1) illustrating a substrate delivering operation.

First, as shown in FIG. 14, the third transfer arm 53a turns the vertical posture of the substrate W received from the second transfer arm 52c to the horizontal posture. At this time, the substrate W is supported by the supporting groove 121 of the first holding guide 120 and the supporting groove 131 of the second holding guide 130, and is clamped by the first clamp member 140 and the second clamp member 150. For this reason, even if the substrate W is changed from the vertical posture into the horizontal posture, the substrate W does not fall from the main body 110.

Figure 15:
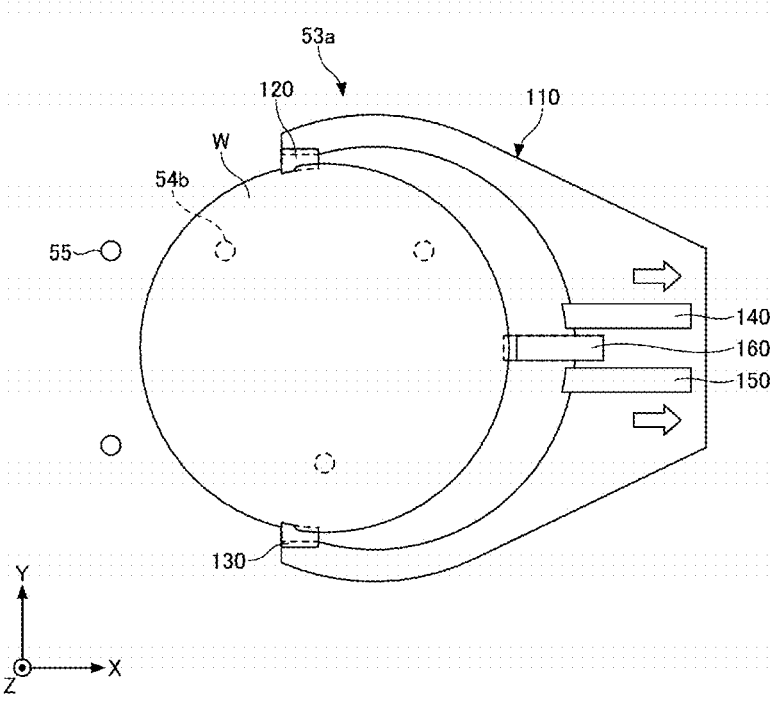
FIG. 15 is a diagram (2) illustrating the substrate delivering operation.

Next, as illustrated in FIG. 15, the first clamp member 140 and the second clamp member 150 move from the closing position to the opening position, whereby the clamping of the substrate W by the first clamp member 140 and the second clamp member 150 is released. As a result, the periphery of the substrate W is supported by the supporting groove 121 of the first holding guide 120 and the supporting groove 131 of the second holding guide 130, and the substrate W is held by the rear surface holding mechanism 160 from the rear surface side.

Figure 16:
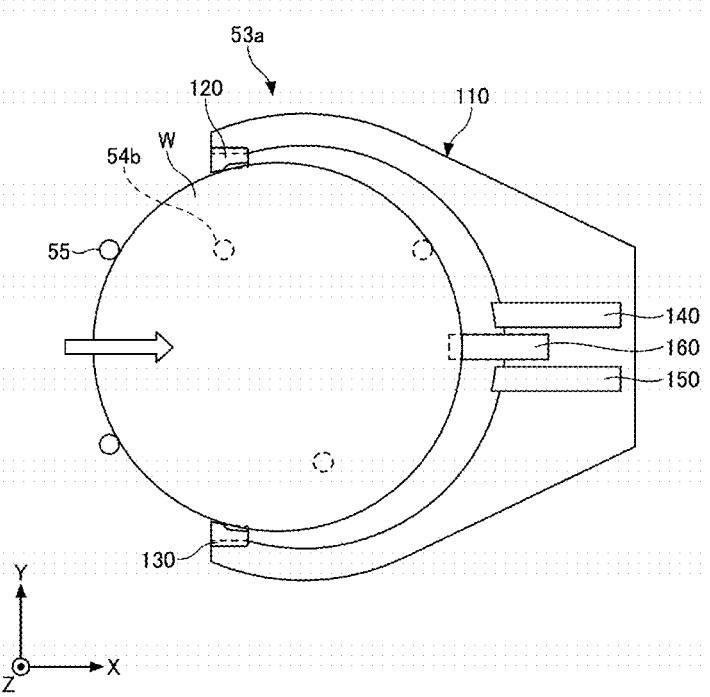
FIG. 16 is a diagram (3) illustrating the substrate delivering operation.

Subsequently, as shown in FIG. 16, the main body 110 moves in the negative X-axis direction to press the substrate W against the pressing member 55, thereby allowing the substrate W to be moved from the position supported by the supporting grooves 121 and 131 to the position supported by the supporting surfaces 122 and 132. That is, the main body 110 moves from the end holding position to the rear surface holding position. The substrate W supported on the supporting surfaces 122 and 132 is highly likely to be misaligned if the main body 110 moves at a high speed. For this reason, the main body 110 moves at a low speed when the substrate W is supported on the supporting surfaces 122 and 132. If a moving distance of the main body 110 from the position where it presses the substrate W against the pressing member 55 to the position where it delivers the substrate W to the second delivery table 54 is short, the distance by which the main body 110 moves at the low speed becomes shorter, so that the transfer time of the substrate W can be shortened. For this reason, it is desirable that the pressing member 55 is disposed above each placement plate 54a and, also, on the negative X-axis side of each placement plate 54a.

Figure 17:
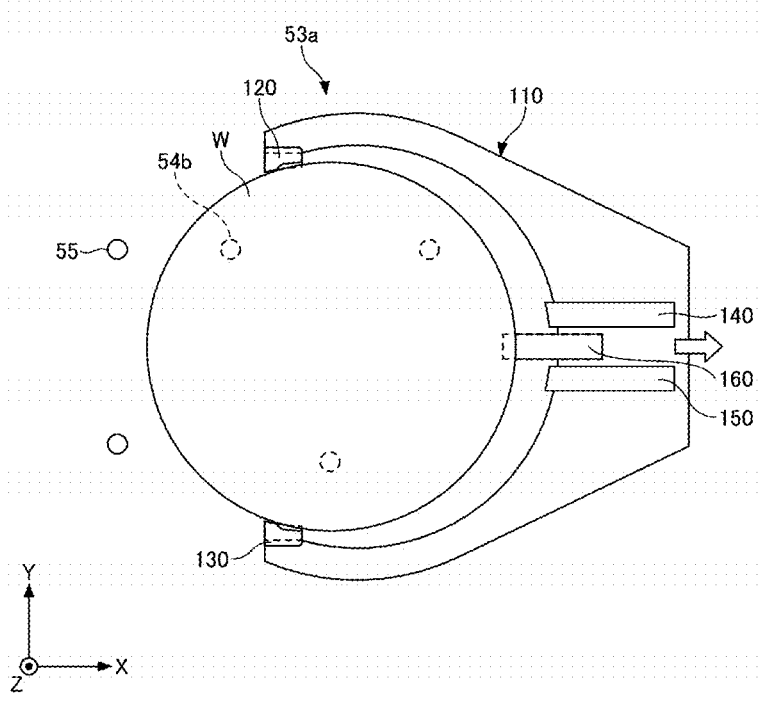
FIG. 17 is a diagram (4) illustrating the substrate delivering operation.

Next, as shown in FIG. 17, the main body 110 moves in the positive X-axis direction to move the substrate W to a position directly above the position where it is to be placed on the second delivery table 54. Next, the main body 110 moves in the negative Z-axis direction. As a result, the substrate W supported by the supporting surfaces 122 and 132 and the rear surface holding mechanism 160 is handed over to the three pins 54*b* of the second delivery table 54.

Figure 18:
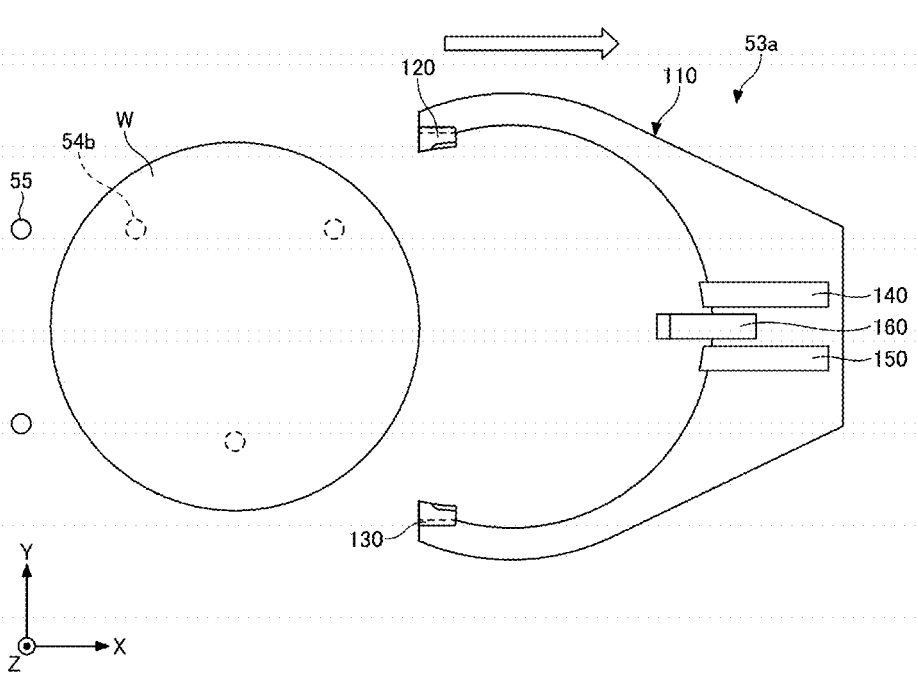
FIG. 18 is a diagram (5) illustrating the substrate delivering operation.

Next, as shown in FIG. 18, the main body 110 moves to the positive X-axis direction. Through the above-described operations, the substrate delivering operation for the single sheet of substrate W is completed.

The above substrate transfer method has been described for the case the substrate W is moved from the position where it is supported by the supporting grooves 121 and 131 to the position where it is supported by the supporting surfaces 122 and 132 by pressing the substrate W held by the main body 110 against the pressing member 55. However, the exemplary embodiment is not limited thereto. For example, instead of the pressing member 55, a suction line may be provided in the rear surface holding mechanism 160. In this case, by suctioning the substrate W through the suction line, the substrate W can be moved from the position where it is supported by the supporting grooves 121 and 131 to the position where it is supported by the supporting surfaces 122 and 132.

In the above substrate transfer method, the third transfer arm 53*a* has one main body 110 and transfers the substrates W one by one from the second transfer arm 52*c* to the second delivery table 54. However, the exemplary embodiment is not limited thereto. By way of example, the third transfer arm 53*a* may have a plurality of main bodies 110 and transfer a plurality of substrates W simultaneously from the second transfer arm 52*c* to the second delivery table 54.

Here, it should be noted that the above-described exemplary embodiments are illustrative in all aspects and are not anyway limiting. The above-described exemplary embodiments may be omitted, replaced and modified in various ways without departing from the scope and the spirit of claims.

According to the exemplary embodiment, it is possible to receive the substrate selectively from a plurality of substrates in a vertical posture arranged along a horizontal direction.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing system, comprising:
a vertical holder configured to hold a substrate in a vertical posture;
a horizontal holder configured to hold the substrate in a horizontal posture;
a transfer device configured to transfer the substrate held by the vertical holder to the horizontal holder, and
a control device configured to control the transfer device,
wherein the transfer device comprises a substrate holder configured to hold the substrate, and
the substrate holder comprises:

a main body having a first arm and a second arm whose leading ends are spaced apart from each other and whose base ends are connected to each other;
a first holding guide fixed to the leading end of the first arm, and configured to hold a periphery of the substrate;
a second holding guide fixed to the leading end of the second arm, and configured to hold the periphery of the substrate; and
a clamp member provided at each of the base ends, and configured to be moved between a closing position where the clamp member clamps the periphery of the substrate and an opening position where the clamp member releases clamping of the substrate,
wherein a length between the first holding guide and the second holding guide is shorter than a diameter of the substrate, and
in a state that the substrate is located closer to the base ends than a position where the substrate is held by the first holding guide and the second holding guide, the entire first arm, the entire second arm, the entire first holding guide and the entire second holding guide are all located diametrically outside the substrate on a same plane as the first arm and the second arm,
wherein the control device performs:
receiving the substrate held by the vertical holder with the substrate holder;
changing the substrate from the vertical posture into the horizontal posture with the substrate holder; and
delivering the substrate in the horizontal posture to a delivery table with the substrate holder,
wherein the control device moves the clamp member to the closing position before changing the substrate from the vertical posture into the horizontal posture.

2. The substrate processing system of claim 1, further comprising:
a rear surface holding mechanism provided at the base ends,
wherein the rear surface holding mechanism is configured to be moved between a closing position where the rear surface holding mechanism holds the substrate from a rear surface side of the substrate and an opening position diametrically outside the substrate.

3. The substrate processing system of claim 2,
wherein the control device moves the rear surface holding mechanism to the closing position before changing the substrate from the vertical posture into the horizontal posture.

4. The substrate processing system of claim 1,
wherein each of the first holding guide and the second holding guide comprises:
a supporting groove configured to support the periphery of the substrate from both a front surface side and a rear surface side of the substrate; and
a supporting surface provided closer to a center of the substrate than the supporting groove, and configured to support the periphery of the substrate from the rear surface side of the substrate.

5. The substrate processing system of claim 4, further comprising:
a pressing member configured to be brought into contact with an end portion of the substrate horizontally held by the substrate holder, and also configured to move the substrate from a position where the substrate is supported by the supporting groove to a position where the substrate is supported by the supporting surface.

6. The substrate processing system of claim 5,
wherein the delivering of the substrate in the horizontal
posture to the delivery table with the substrate holder
comprises pressing the substrate against the pressing
member through a horizontal movement of the sub- ⁵
strate holder, thereby moving the substrate from the
position where the substrate is held by the supporting
groove to the position where the substrate is supported
by the supporting surface.

7. The substrate processing system of claim 5, ¹⁰
wherein the substrate includes multiple substrates,
the vertical holder is configured to hold the multiple
substrates at a certain distance therebetween, and
the receiving of the substrate held by the vertical holder
with the substrate holder comprises: ¹⁵
moving the substrate holder to a same plane as the
substrate in a direction perpendicular to a front surface
of the substrate; and
moving the substrate holder upwards to allow the sub-
strate to be held by the first holding guide and the ²⁰
second holding guide.

8. The substrate processing system of claim 5,
wherein the substrate includes multiple substrates, and the
substrate holder includes multiple substrate holders,
the vertical holder is configured to hold the multiple ²⁵
substrates at a certain distance therebetween,
the transfer device comprises the multiple substrate hold-
ers, and
the receiving of the substrate held by the vertical holder
with the substrate holder comprises receiving the mul- ³⁰
tiple substrates held by the vertical holder all at once by
the multiple substrate holders.

9. A substrate transfer method in which a transfer device
transfers a substrate from a vertical holder configured to
hold the substrate in a vertical posture to a horizontal holder ³⁵
configured to hold the substrate in a horizontal posture,
    wherein the transfer device comprises a substrate holder
    configured to hold the substrate, and the substrate holder comprises:
a main body having a first arm and a second arm whose
    leading ends are spaced apart from each other and
    whose base ends are connected to each other;
a first holding guide fixed to the leading end of the first
    arm, and configured to hold a periphery of the sub-
    strate; and
a second holding guide fixed to the leading end of the
    second arm, and configured to hold the periphery of the
    substrate; and
a clamp member provided at each of the base ends, and
    configured to be moved between a closing position
    where the clamp member clamps the periphery of the
    substrate and an opening position where the clamp
    member releases clamping of the substrate,
wherein a length between the first holding guide and the
    second holding guide is shorter than a diameter of the
    substrate,
in a state that the substrate is located closer to the base
    ends than a position where the substrate is held by the
    first holding guide and the second holding guide, the
    entire first arm, the entire second arm, the entire first
    holding guide and the entire second holding guide are
    all located diametrically outside the substrate on a same
    plane as the first arm and the second arm, and
the substrate transfer method comprises:
receiving, by the substrate holder, the substrate held by
    the vertical holder;
changing, by the substrate holder, the substrate from the
    vertical posture into the horizontal posture; and
delivering, by the substrate holder, the substrate in the
    horizontal posture to a delivery table,
wherein the clamp member is moved to the closing
    position before changing the substrate from the vertical
    posture into the horizontal posture.

* * * * *